United States Patent
Ehrenberg

(10) Patent No.: US 10,814,609 B2
(45) Date of Patent: Oct. 27, 2020

(54) SYSTEMS AND METHODS FOR SELECTIVELY COATING A SUBSTRATE USING SHADOWING FEATURES

(71) Applicant: Massachusetts Institute of Technology, Cambridge, MA (US)

(72) Inventor: Isaac Mayer Ehrenberg, Brookline, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 559 days.

(21) Appl. No.: 15/462,798

(22) Filed: Mar. 17, 2017

(65) Prior Publication Data

US 2017/0273196 A1    Sep. 21, 2017

Related U.S. Application Data

(60) Provisional application No. 62/309,510, filed on Mar. 17, 2016.

(51) Int. Cl.
*C23C 14/04* (2006.01)
*B33Y 80/00* (2015.01)
(Continued)

(52) U.S. Cl.
CPC ............ *B33Y 80/00* (2014.12); *C23C 14/044* (2013.01); *C23C 14/20* (2013.01); *H05K 3/1258* (2013.01);
(Continued)

(58) Field of Classification Search
None
See application file for complete search history.

(56) References Cited

U.S. PATENT DOCUMENTS

2015/0342031 A1*  11/2015  Song .................. H01Q 15/0026
174/350

FOREIGN PATENT DOCUMENTS

WO    WO-2009064888 A1 *  5/2009  ............. H05K 3/048

OTHER PUBLICATIONS

Ehrenberg, I., "Design of a Broadband Conformal FSS Consisting of 3D Elements," GOMAC Tech (Government Microcircuit Applications & Critical Technology Conference) 2016 presentation; Mar. 14-17, 2016; Orlando, FL.
(Continued)

*Primary Examiner* — David P Turocy
(74) *Attorney, Agent, or Firm* — Nutter McClennen & Fish LLP

(57) ABSTRACT

Systems and methods for producing electromagnetic devices are provided. The systems and methods allow for an electromagnetic device having both a substrate (e.g., polymer) and conductive material (e.g., metal) to be manufactured without using masks or other outside objects disposed over a surface (e.g., the substrate) onto which the conductive material is deposited. In one exemplary embodiment, the method includes performing additive manufacturing using a polymer to produce a device having a plurality of interconnected walls and a plurality of frequency selective surface elements, and then coating portions of the device with a conductive material. A plurality of shadowing features are formed as part of one or more of the walls to protect the frequency selective surface elements from being coated by the conductive material. Other methods, and a variety of systems that can result from the disclosed methods, are also provided.

24 Claims, 11 Drawing Sheets

(51) Int. Cl.
*H05K 3/12* (2006.01)
*H05K 3/14* (2006.01)
*C23C 14/20* (2006.01)
*B33Y 10/00* (2015.01)

(52) U.S. Cl.
CPC .............. *H05K 3/146* (2013.01); *B33Y 10/00* (2014.12); *H05K 2201/09036* (2013.01)

(56) References Cited

OTHER PUBLICATIONS

Mittra, R. and C. Pelletti, "Three-Dimensional FSS Elements with Wide Frequency and Angular Responses," 2012 IEEE Antennas and Propagation Society International Symposium (APSURSI), Jul. 8-14, 2012; 2 pages.

Pelletti, C. et al., "Frequency selective surface with wideband quasi-elliptic bandpass response," Electronics Letters, 2013, v. 49, p. 1052-1053.

Pelletti, C. et al., "Three Dimensional FSS Elements with Wide Frequency and Angular Response," Proceedings of 2013 URSI International Symposium on Electromagnetic Theory; May 20-24, 2013; 3 pages.

\* cited by examiner

SYSTEMS AND METHODS FOR SELECTIVELY COATING A SUBSTRATE USING SHADOWING FEATURES

CROSS REFERENCE TO RELATED APPLICATION

The present application claims priority to and the benefit of U.S. Provisional Application No. 62/309,510, filed on Mar. 17, 2016, and titled "Process for the Selective Coating of a Substrate," the content of which is incorporated herein by reference in its entirety.

GOVERNMENT RIGHTS

This invention was made with Government support under Grant No. FA8650-14-D1714 awarded by the Air Force Research Laboratory. The Government has certain rights in the invention.

FIELD

The present application relates to systems and methods for fabricating substrates, and more specifically to selectively coating fabricated substrates using shadowing features fabricated thereon.

BACKGROUND

Efforts are underway to utilize the rapid prototyping capabilities of additive manufacturing for the fabrication of electromagnetic devices, including in the radio frequency (RF) and microwave domains, where interests can be found in uses for military, space, and aeronautics, among other industries. For example, antennas and other associated components of a radar or communication system can benefit from being rapidly built. Methods for producing components such as antennas and the like are often evaluated based on competing interests of size, weight, performance for a particular application, and expense. Current technology is often incredibly expensive. Additive manufacturing, however, has the flexibility to make an impact on all four of the aforementioned factors by enabling previously inconceivable designs that can ultimately reduce the size and weight of RF devices while improving performance and lowering the cost of development.

There are many challenges, however, associated with trying to apply additive manufacturing techniques to the fabrication of electromagnetic devices. For example, there are many material limitations inherent to most additive manufacturing processes. This is because most additive manufacturing processes are designed to handle either substrates (e.g., polymers) or conductive materials (e.g., metals), but are not capable of constructing a part that comprises both a substrate and a conductive material. This means the electrical properties of a part are either conductive or those of a dielectric, but not both. This leaves most electromagnetic fabrication problems to be solved through printed circuit board processes. Attempts have been made to optimize the combination of conductive and dielectric properties into a single board. Printed circuit board processes, however, do not easily translate to the fabrication of electromagnetic devices. Further, there are drawbacks to the printed circuit board processes, including but not limited to the possibility of electrical shorts occurring because traces are undesirably electrically connected.

In some instances, additive manufacturing that requires both a substrate and one or more conductive material is performed using a mask or other outside object or structure disposed over a surface onto which the conductive material is deposited (e.g., the substrate) to control a location of the conductive material. For example, first the substrate is deposited, then a mask or other outside object or structure is placed on the substrate, and then the conductive material is deposited onto the substrate, around the mask. However, as the design of the desired electromagnetic devices becomes more complex and/or intricate, the complexity as it applies to masks and the like is at least two-fold. First, it can be difficult to design and produce a mask having a more intricate or complex design due to the complex geometrical features involved. Second, it can be difficult for the mask to maintain its desired shape as complex geometrical features may not provide as much support for portions of the mask, thus causing the mask to move, shift, and/or collapse. This results in difficulties controlling where conductive metal particles ultimately settle—just as if no mask was involved at all.

Accordingly, there is a need for systems and methods that allow a substrate to be coated with a conductive material without using masks or other outside objects or structures disposed over the substrate onto which the conductive material is to be deposited.

SUMMARY

The present disclosure generally provides for systems and methods for producing electromagnetic devices. Many different electromagnetic devices can be formed in view of the present disclosures, including but not limited to circuit boards. The disclosed systems and methods allow for both a substrate (e.g., polymer) and conductive material (e.g., metal) to be used in the manufacturing of electromagnetic devices without using outside objects or structures (e.g., masks) to help control the deposition of the conductive material with respect to the substrate. As described in greater detail below, shadowing features are incorporated directly into the substrate as it is manufactured, and the shadowing features are then used as a way to control the deposition of the conductive material. Although the systems and methods described herein are primarily described in conjunction with additive manufacturing techniques, a person skilled in the art will recognize the present disclosures can be adapted for use with other manufacturing techniques without departing from the spirit of the present disclosure.

In one exemplary embodiment of a method for producing an electromagnetic device, the method includes performing additive manufacturing using a polymer to produce a device having a plurality of interconnected walls and a plurality of frequency selective surface (FSS) elements, and coating portions of the device with a conductive material. Each FSS element of the plurality of FSS elements has a first terminal end and a second terminal end, with the first terminal end of each FSS element being coupled to a wall of the plurality of interconnected walls and the second terminal end of each FSS element being coupled to a wall of the plurality of interconnected walls. The wall can be the same wall, although they do not have to be the same walls. A plurality of shadowing features are formed as part of one or more walls of the plurality of interconnected walls. The shadowing features are configured to protect a portion of the FSS element disposed in the respective feature and/or a portion of the wall to which the FSS element is coupled from being coated by the conductive material during the coating step.

The term protecting may mean that no conductive material is deposited on at least some of the protected portion, or it may mean that inconsequential amounts of conductive material are deposited on at least some of the protected portion. An inconsequential amount can be an amount that is not significant enough so as to create a completed conductive path because the shadowing feature is designed to provide a break in contact between conductive portions or portions that may become conductive, for instance through deposition of a conductive material onto the substrate. A person skilled in the art will understand what an inconsequential amount is in view of the present disclosures. It is at least an amount that is less than the amount deposited onto the substrate that is intended to be conductive.

The step of coating portions of the device with a conductive material can be performed without the use of a mask or other object or structure disposed over a surface onto which the conductive material is deposited to control a location of the conductive material. The surface can be, for example, the surface that results from the use of the polymer, which can form a substrate. In some embodiments, the plurality of interconnected walls and the plurality of FSS elements can be produced simultaneously during a single manufacturing pass.

The plurality of shadowing features can be formed as part of one or more walls of the plurality of interconnected walls during the time the step of performing additive manufacturing using a polymer to produce a device having a plurality of interconnected walls is performed. In some embodiments, a base of the plurality of interconnected walls can be non-planar.

An exemplary embodiment of an electromagnetic device includes a plurality of interconnected walls, a plurality of shadowing features, and a plurality of frequency selective surface (FSS) elements. The shadowing features are formed in the plurality of interconnected walls such that one or more shadowing features are formed in at least one wall of the plurality of interconnected walls. They can be formed in multiple walls. Each FSS element has a first terminal end and a second terminal end. The first terminal end of each FSS element is coupled to a wall of the plurality of interconnected walls, and the second terminal end of each FSS element is coupled to a wall of the plurality of interconnected walls. The walls can be the same wall, although they do not have to be the same wall. The first terminal end of at least one FSS element is disposed in a first shadowing feature of the plurality of shadowing features and the second terminal end of the same FSS element is disposed in a second shadowing feature of the plurality of shadowing features.

In some embodiments, the plurality of interconnected walls can include four walls that form a rectangular shape, the plurality of shadowing features can include eight shadowing features with two shadowing features being formed in each of the four walls, and the plurality of FSS elements can include four FSS elements with the terminal ends of each of the elements being disposed in a separate shadowing feature of the eight shadowing features.

One or more additional electromagnetic devices can be provided to form an array of electromagnetic devices. Each device of the one or more electromagnetic devices can be similarly configured to the earlier described electromagnetic device, or they can have different configurations. Thus, in some embodiments, each electromagnetic device of the one or more electromagnetic devices can include a plurality of interconnected walls, a plurality of shadowing features, and a plurality of FSS elements. The shadowing features can be formed in the plurality of interconnected walls such that one or more shadowing features are formed in at least one wall of the plurality of interconnected walls. They can be formed in multiple walls. Each FSS element can have a first terminal end and a second terminal end, with the first terminal end of each FSS element being coupled to a wall of the plurality of interconnected walls, and the second terminal end of each FSS element being coupled to a wall of the plurality of interconnected walls. The walls can be the same wall, although they do not have to be the same wall. The first terminal end of at least one FSS element can be disposed in a first shadowing feature of the plurality of shadowing features and the second terminal end of the same FSS element can be disposed in a second shadowing feature of the plurality of shadowing features. The one or more additional electromagnetic devices can share at least one wall of the plurality of interconnected walls in common.

A thickness of at least one of the shadowing features of the plurality of shadowing features can be greater than a thickness of the wall in which the shadowing feature is formed. In some embodiments, the shadowing feature can include a block having opposed first and second block walls. The first block wall can have a bore formed in it through which the FSS element disposed in the shadowing feature passes through, and the second block wall can be the wall to which the first or second terminal end of the FSS element is coupled. In some embodiments, the shadowing feature can include one or more ledges formed in it. The ledges can be configured to protect a portion of the FSS element disposed in the shadowing feature and/or a portion of the wall to which the FSS element is coupled from a coating when a coating is applied to the electromagnetic device. The one or more ledges can further include stepped ledges that provide for multiple ledges having different configurations (e.g., shapes, sizes, etc.) formed in the shadowing feature.

The plurality of interconnected walls can include a polymer coated in a metal. The plurality of shadowing features can include a polymer having portions of it coated in a metal with at least some portions not coated in a metal, or at least coated in less metal that other portions of the associated interconnected wall. The plurality of FSS elements can include a metal.

In one exemplary method for producing a printed circuit board, the method includes performing additive manufacturing to produce a substrate having a plurality of channels formed in it that extend through a portion of a thickness of the substrate such that a depth of the channel is less than a thickness of the portion of the substrate in which the respective channel is formed. At least one channel of the plurality of channels has a first width at a top surface of the substrate and a second width at a location disposed below the top surface. The second width is greater than the first width such that the at least one channel includes a shadowing feature. The method further includes coating portions of the substrate with a conductive material to form a plurality of traces in conjunction with the channels. The portions of the channel associated with the shadowing feature receives less conductive material than other portions of the channel.

A base of the substrate can be non-planar (i.e., curved). In some embodiments, the step of performing additive manufacturing to produce a substrate is performed using silicon. The conductive material can include a metal.

One exemplary embodiment of a printed circuit board includes a substrate, a plurality of traces formed on a top surface of the substrate, and a plurality of shadowing features disposed below the top surface of the substrate. The shadowing features are configured such that a portion of the substrate is less accessible to receive material deposited onto the substrate than portions of the substrate not associated with the shadowing features. Although the traces are described as being formed on a top surface of the substrate, a person skilled in the art, in view of the present disclosures, will understand that at least a portion of the traces may be disposed below the top surface.

In some embodiments, the printed circuit board can include a plurality of channels formed in the substrate. The channels can extend through a portion of a thickness of the substrate such that at depth of the channel is less than a thickness of the portion of the substrate in which the respective channel is formed. At least two channels of the plurality of channels can have a first width at the top surface of the substrate and a second width at a location disposed below the top surface. The second width can be greater than the first width such that each channel of the at least two channels includes a shadowing feature of the plurality of shadowing features. The plurality of traces can be associated with the plurality of channels. At least a portion of the traces may extend into a portion of the respective channels. In some embodiments, a base of the substrate can be non-planar.

BRIEF DESCRIPTION OF DRAWINGS

The present application will be more fully understood from the following detailed description taken in conjunction with the accompanying drawings, in which.

DETAILED DESCRIPTION

Certain exemplary embodiments will now be described to provide an overall understanding of the principles of the structure, function, manufacture, and use of the systems and methods disclosed herein. One or more examples of these embodiments are illustrated in the accompanying drawings. Those skilled in the art will understand that the systems and methods specifically described herein and illustrated in the accompanying drawings are non-limiting exemplary embodiments and that the scope of the present disclosure is defined solely by the claims. The features illustrated or described in connection with one exemplary embodiment may be combined with the features of other embodiments. Such modifications and variations are intended to be included within the scope of the present disclosure. Further, in the present disclosure, like-numbered components of various embodiments generally have similar features when those components are of a similar nature and/or serve a similar purpose.

The present disclosure includes some illustrations and descriptions that include prototypes or bench models. A person skilled in the art will recognize how to rely upon the present disclosure to integrate the techniques, systems, and methods provided for into a product, such as a consumer-ready, factory-ready, or lab-ready three-dimensional printer for fabricating substrates.

Exemplary embodiments of the present disclosure provide for manufacturing of substrates for electromagnetic (EM) devices. In some exemplary embodiments, the EM devices described are frequency selective surface (FSS) with a three dimensional unit cell (referred to herein as "FSS cell").

Exemplary embodiments of the present disclosure provide for fabricating and coating substrates for electromagnetic (EM) devices. In some exemplary embodiments, the EM devices described are Frequency Selective Surface (FSS) with a three dimensional unit cell (referred to herein as "FSS cell"), or printed circuit boards (PCBs).

Electromagnetic Devices with Shadowing Features

Frequency Selective Surface Cells

Figure 1:
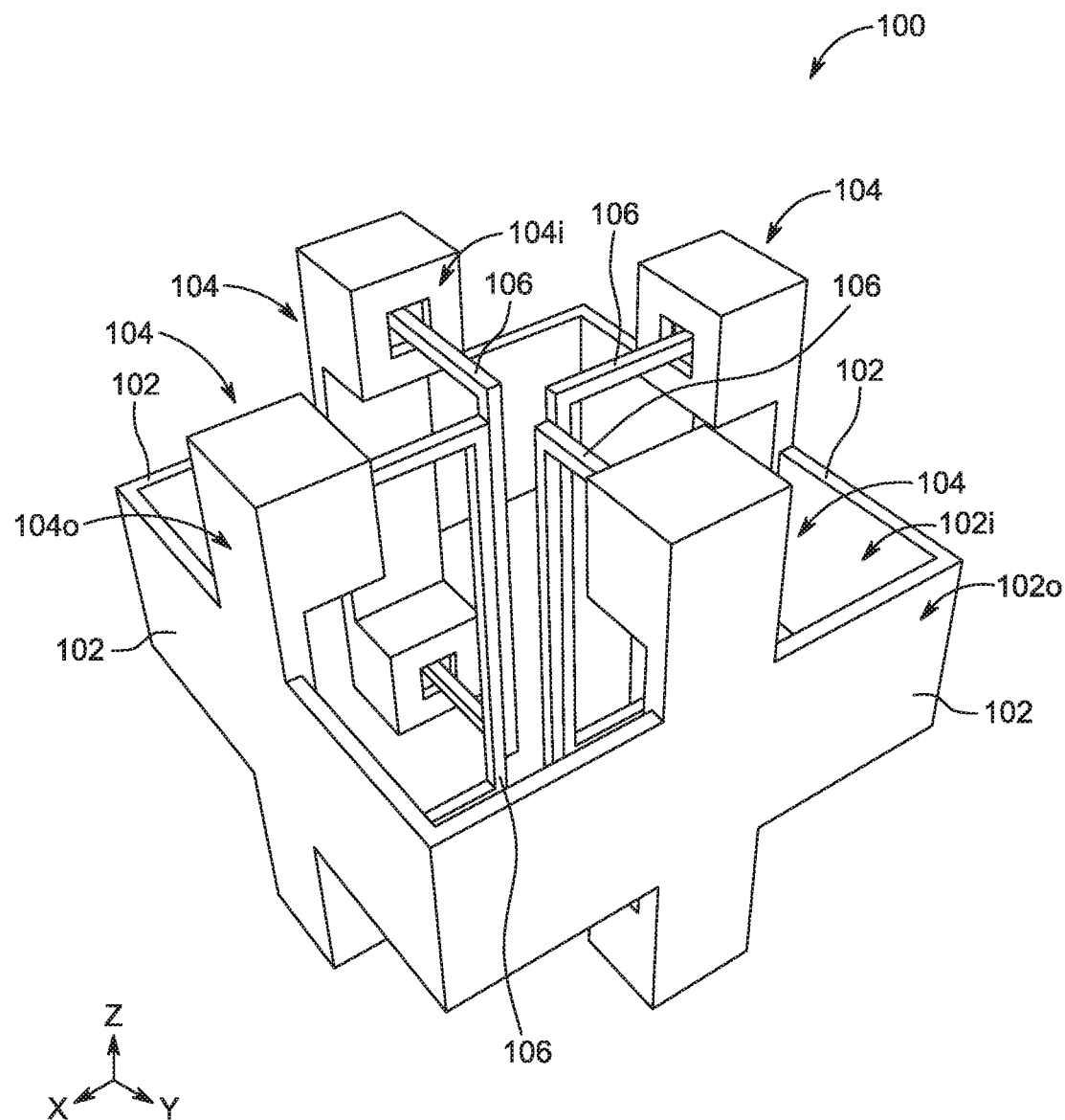
FIG. 1 is a perspective view of one exemplary embodiment of a three-dimensional FSS cell.

FIG. 1 is a perspective view of one exemplary embodiment of a three-dimensional FSS cell 100. As will be described in further detail below, the FSS cell 100 includes shadowing features that are used to shadow (e.g., protect, cover, shield) portions of the FSS cell 100 from being coated (or fully coated) during a coating procedure. It should be understood that the FSS cell 100 illustrated in FIG. 1 is one example of an electromagnetic device that can be designed, fabricated and used in accordance with the embodiments described herein, although other electromagnetic devices are contemplated.

The FSS cell 100 can be fabricated using various techniques known by those skilled in the art, including, for example, additive manufacturing (AM) technologies such as three-dimensional printing, rapid prototyping, direct digital manufacturing, layered manufacturing and additive fabrication. The additively manufactured FSS cell 100 is a substrate made up of a non-conductive material such as plastic, fiberglass or other polymers known by those skilled in the art. The FSS cell 100 including its interconnected walls 102 and other parts (and/or an array of FSS cells such as 220 or 420 illustrated below in FIGS. 2B and 4B) can be printed in a single additive manufacturing or three-dimensional printing session and/or as a single printed unit.

In turn, the fabricated FSS cell 100 is coated with one or more conductive materials. One example of a conductive material is metal. Non-exhaustive examples of suitable metals for coating the FSS cell 100 include a thin metal film of copper, gold, silver, nickel (or other conductive metals known by those of skill in the art) to add conductive or electromagnetic properties thereto. Coating of the FSS cell 100 refers to the deposition of the conductive material (e.g., metal) onto the substrate FSS cell using various techniques known by those of skill in the art, including sputtering, physical vapor deposition, electron beam deposition, thermal evaporation based metal deposition, spraying, splattering, splashing, spray painting and the like. The shadowing features of the FSS cell 100 allow for portions of the FSS cell 100 to not be coated (or to be coated less than other portions or areas of the FSS cell) such that the electrical conductivity between portions of the FSS cell 100 can be separated or discontinued relative to the fully or normally coated areas. Notably, the shadowing features reduce or eliminate the need for stencils or masks to be used to control the deposition of metal onto the generated FSS cell. In some embodiments, the shadowing features can be referred to as embedded masks—indicating that the FSS cell or other structure itself has geometric features that provide selective coating (e.g., controlled coating of a desired or target location).

More specifically, the FSS cell 100 includes walls 102, shadowing features 104 and FSS elements 106. The walls 102 function as a low frequency filter of the FSS cell, the FSS elements 106 (e.g., portions thereof) function as high frequency filters, and the shadow features 106 protect parts—e.g., ends—of the FSS elements 106 from being fully or normally coated. The walls 102 can be interconnected with one another.

Each of the walls 102 includes an inner surface 102*i* and an outer surface 102*o*. Together, the walls 102 can form a geometric structure such as a rectangle, as shown in FIG. 1. When an FSS cell is printed as part of an array, the outer surface of a wall of the FSS cell can be adjacent to or touching the outer surface of a wall of another FSS cell, or can be exposed if the FSS cell is the edge or border of the array. The inner surfaces 102*i* of each wall 102 of the FSS cell 100 are positioned such that they face each other and in the direction of the FSS elements 106.

It should be understood that the height (measured in a direction along the Z axis), width (measured along the X or Y axes), and thickness of each of the walls (measured from the inner surface to the outer surface of a wall, along the X or Y axes) of an FSS cell can vary within a single wall, or relative to walls in the same or different FSS cells. The dimensions of the walls themselves and their dimensions relative to the rest of the FSS element have an effect on the mechanical and electrical properties of the FSS, such as the mechanical strength, and the upper frequency, lower frequency and bandwidth of the FSS elements that make up an FSS filter. Thus, these dimensions can be selected to achieve desired properties (e.g., mechanical strength, and the upper frequency, lower frequency and bandwidth) of the FSS cell. In some embodiments, outer surfaces of the walls 102, and/or their inferior or superior surfaces can for a planar or non-planar surface. That is, the base or inferior surface of a plurality of walls of FSS cells can be fabricated to form a curved or cone structure, such that the set of FSS calls can be attached to or disposed on an structure having a curved surface of inverse geometry.

The FSS elements 106 are filters for electromagnetic waves. The FSS elements 106 are configured to function as a band pass filter with a wide bandwidth and sharp cutoffs above and below the pass band.

The FSS cell 100 also includes shadowing features 104. While the FSS cell 100, including its walls 102 and shadowing features 104, are printed as a single unit, it should be understood that the shadowing features 104 can be identified or referred to separately from their respective walls 102, as shown in exemplary FIG. 1. This is useful, for example, when the thickness of the shadowing features 104 is different than the thickness of the walls 102, as in FIG. 1. The shadowing features 104 and the respective walls 102 can be referred to or identified together, for example, in embodiments in which the walls and shadowing features have a substantially similar thickness. It should be understood that in some embodiments the walls may have or correspond to a plurality of shadowing features, such as one, two, four, eight, or more shadowing features per wall.

The shadowing features 104 of the FSS cell 100 include an inner surface 104*i* and an outer surface 104*o*. As shown in FIG. 1, the thickness of the shadowing features 104 (which is measured as the distance between the inner surface 104*i* and outer surface 104*o* of a shadowing feature) can differ from the thickness of their respective walls. That is, in FIG. 1, the shadowing features 104 are thicker than the walls 102. It should be understood that the height, width and thickness of the shadowing features can vary within a single shadowing feature, or relative to other shadowing features in the same or different FSS cells.

Each of the shadowing features 104 includes a region—also referred to herein as the "shadowing region"—that is disposed or fabricated on or relative to the inner surfaces 104*i* of the shadowing features 104. The shadowing regions are designed and fabricated in a manner that enable the shadowing (e.g., protecting, shielding) of at least a portion of a respective FSS element 106, such that the shadowed portion (e.g., terminal end) of the FSS element is coated differently (e.g., less) than another portion (e.g., a substantially adjacent portion) of the same FSS element 106. It should be understood that the shadowed portion or terminal end of the FSS element refers to a region of different sizes and locations. That is, the terminal end can refer to an area of the FSS element where conductivity is discontinued, rather than merely an end-point of the FSS element structure. In some embodiments, an FSS element can includes one, two, or more terminal ends. Further, in some embodiments, the shadowing features can also shadow, protect, or shield portions of the walls of the FSS cell.

As shown in FIG. 1, the exemplary shadowing features 104 include a rectangular hollow portion—i.e., a concave or void area extending from the inner surface 104*i* in a direction towards the outer surface 104*o*—of the shadowing features 104. The dimension, shape and positioning of the shadowing regions on the shadowing features 104 can vary, and can be fabricated based on factors such as the type of coating process and material to be used, the angle or angles or the coating, the dimensions of the FSS elements, the type of substrate, environmental factors, and other factors understood by those of skill in the art.

For instance, in some embodiments, the shadowing regions of shadowing features need not be hollow or concave relative to the inner surface of the shadowing features, as shown in exemplary FIG. 1. Instead (or additionally) the shadowing region can be or have a convex portion—i.e., extending from the inner surface of a shadowing feature in a direction extending away from the outer surface of the shadowing feature. Moreover, in some embodiments, the shadowing region can be circular, triangular, or other shapes. Further, in some embodiments such as those in which the shadowing region is a convex portion, the shadowing region need not form a closed geometry such as a full circle or rectangle. Instead, the shadowing region can be a semi-circle, arc, plane, bracket shape, or the like, that is optimally positioned relative to the corresponding FSS element in an area where the coating of the FSS element can best be forecasted and/or controlled.

Still with reference to the shadowing features 104 of the FSS cell 100, it should be understood that although not shown in FIG. 1, the FSS elements 106 are connected to, attached to or formed on the shadowing features 104. That is, the FSS cell 100 is fabricated such that ends of the FSS elements 106 touch and connect to their respective shadowing features 104 (or, to the walls 102, for instance, in embodiments in which the walls are said or interpreted to include or have incorporated therein the shadowing features 104) at a supplemental surface of their respective shadowing regions. For instance, in an embodiment such as that illustrated in FIG. 1 in which the shadowing region of a shadowing feature 104 is concave, the supplemental surface of the shadowing feature refers to the surface of the shadowing region that is parallel (or substantially parallel, or most parallel among surfaces of the shadowing region) to the inner and outer surfaces of the shadowing feature 104. In other embodiments such as those in which the shadowing region is convex, the supplemental surface can be the inner surface 104i of the shadowing feature 104.

As described above, the shadowing features protect or shield a portion of the FSS elements from being coated, for example, with a metal (or other conductive) coating material. In this way, although the FSS elements 106 are fabricated such that they are physically connected to the other portions of the FSS cell 100 (e.g., walls 102, shadowing features 104), when the FSS cell 100 is coated, conductivity is severed or avoided by the non-coated or less coated portions of the FSS elements.

In some embodiments, the shadowing features include a block having opposed first and second block walls. The first block wall has a bore formed therein through which the frequency selective surface element disposed in the shadowing feature passes through. The second block wall is the wall to which the first or second terminal end of the frequency selective surface element is coupled. The shadowing features may each include one or more ledges formed therein. The ledges are configured to protect at least one of a portion of the frequency selective surface element disposed in the shadowing feature and/or a portion of the wall to which the frequency selective surface element is coupled from a coating when a coating is applied to the electromagnetic device. As illustrated below in further detail in connection with FIG. 3B, the ledges may be stepped ledges providing for multiple ledges having different configurations formed in the shadowing feature. In other words, stepped ledges can refer to walls or surfaces of the shadowing features having varying geometries such as increasing or decreasing widths and/or thicknesses analogous to stairs or steps.

Figure 2A:
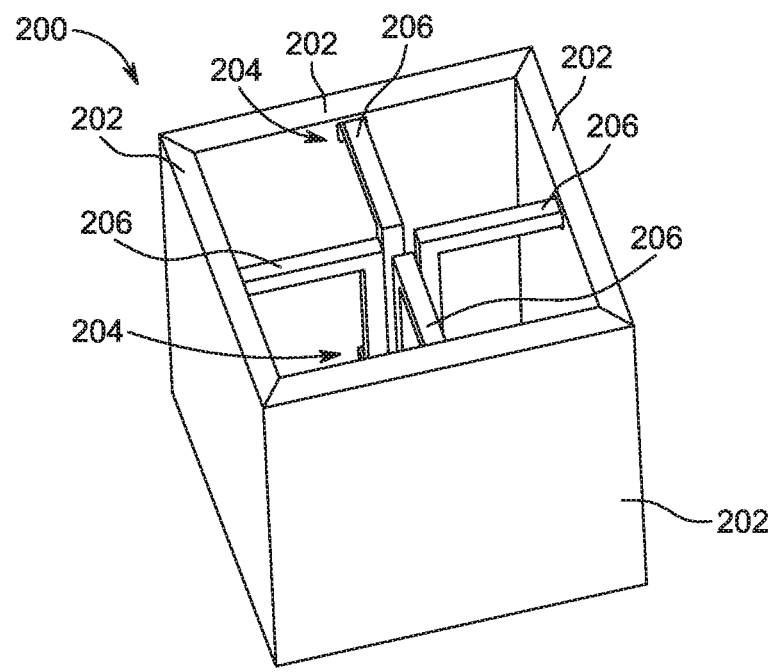
FIG. 2A is a perspective view of another exemplary embodiment of an FSS cell having shadowing features.

FIG. 2A is a perspective view of another exemplary embodiment of an FSS cell 200 having shadowing features. As shown, the FSS cell 200 includes walls 202, shadowing features 204, and FSS elements 206. As described above in connection with FIG. 1, the walls 202 and shadowing features 204 include interior and outer surfaces relative to the FSS elements 206. In FIG. 2A, the shadowing features 204 are designed such that they are seamlessly incorporated into the walls 202. It can be said thus that the walls 202 and the shadowing features 204 have a same (or substantially the same) thickness and/or width. The shadowing features 204 include shadowing regions configured to shield, protect or shadow terminal ends of the FSS elements 206 during a metal coating of the FSS cell 200.

Figure 2B:
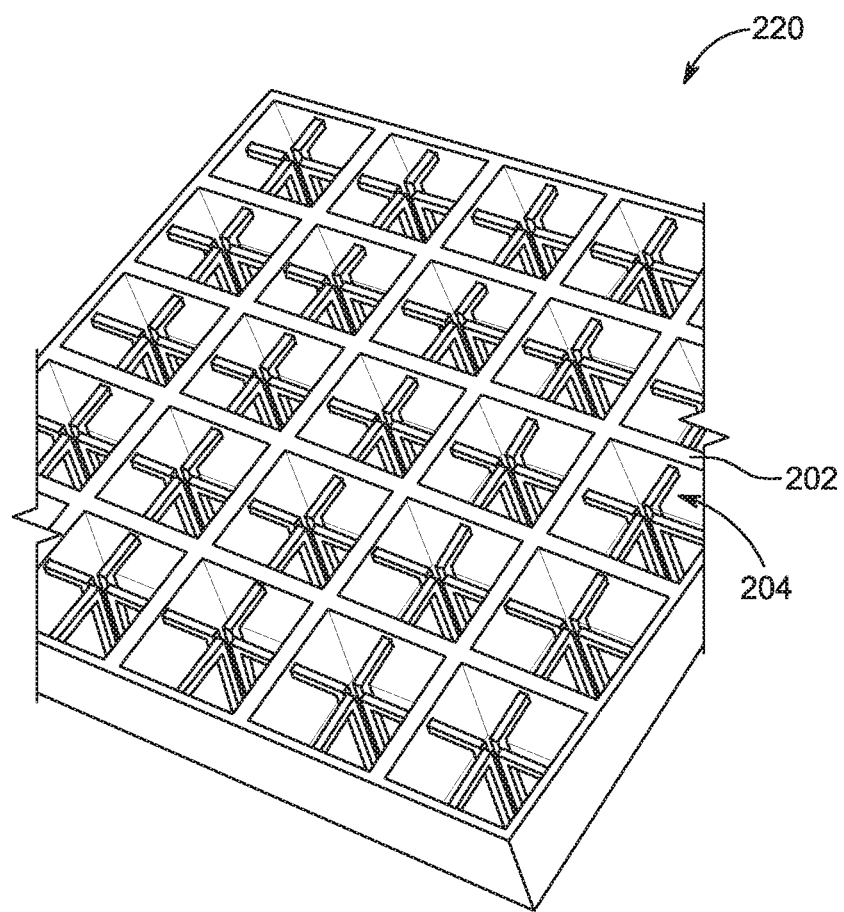
FIG. 2B is a perspective view of one exemplary embodiment of an array of the FSS cells of FIG. 2A.

FIG. 2B is a perspective view of one exemplary embodiment of an array 220 of FSS cells 200. The array 220 is made up of twenty five FSS cells 200. The entire array 220 can be printed during a single three-dimensional printing session, and can be fabricated as a single, interconnected structure.

Each of the FSS cells 200 in the array 220 includes walls 202, shadowing features 204 and FSS elements 206. Adjacent FSS cells 200 can have walls 202 that are adjacent to one another. In other embodiments, a wall 202 can be a shared or common wall that forms a part of two adjacent FSS cells 202. In such embodiments, the thickness of the shared wall 202 can be increased to allow for concave shadowing regions of respective shadowing features to be fabricated such that (1) they are thick or deep enough to provide adequate protection or shielding of the FSS elements 206, and (2) they do not penetrate through the wall to form a hole from one interior surface to another.

Figure 3A:
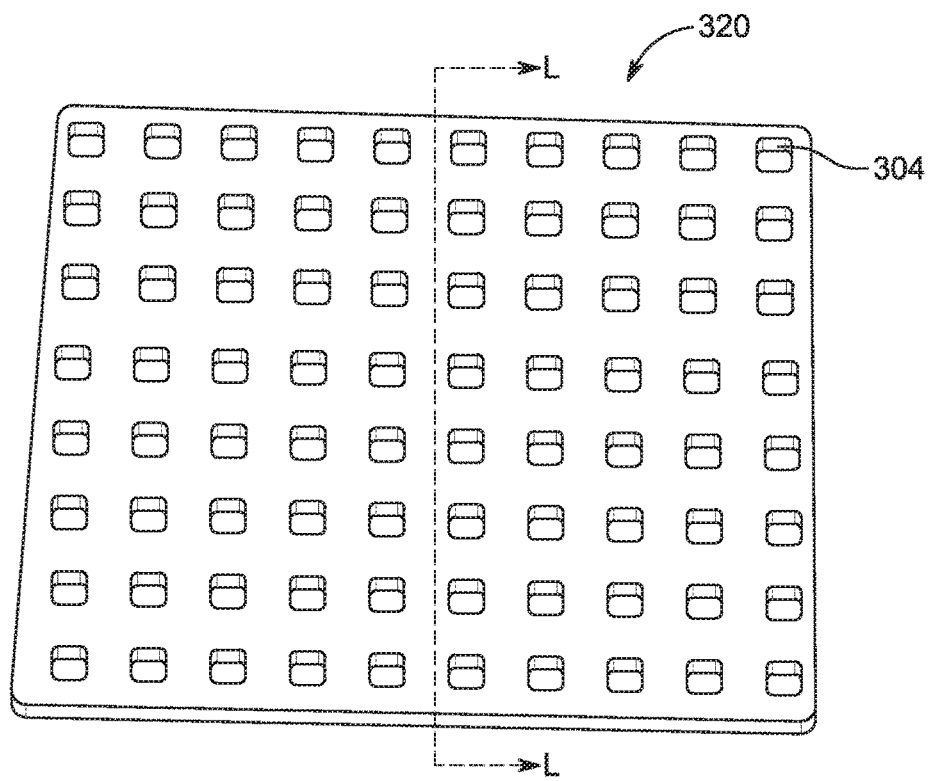
FIG. 3A is a perspective view of one exemplary embodiment of an array of shadowing features.

FIG. 3A is a perspective view of one exemplary embodiment of an array 320 of shadowing features 304. Although not visible in FIG. 3A, each of the shadowing features 304 has a respective element attached to and/or fabricated such that it extends in a direction away from and substantially perpendicular to a supplemental surface of the shadowing feature. The shadowing features 304 are thus configured to protect or shield corresponding elements during a coating process.

Figure 3B:
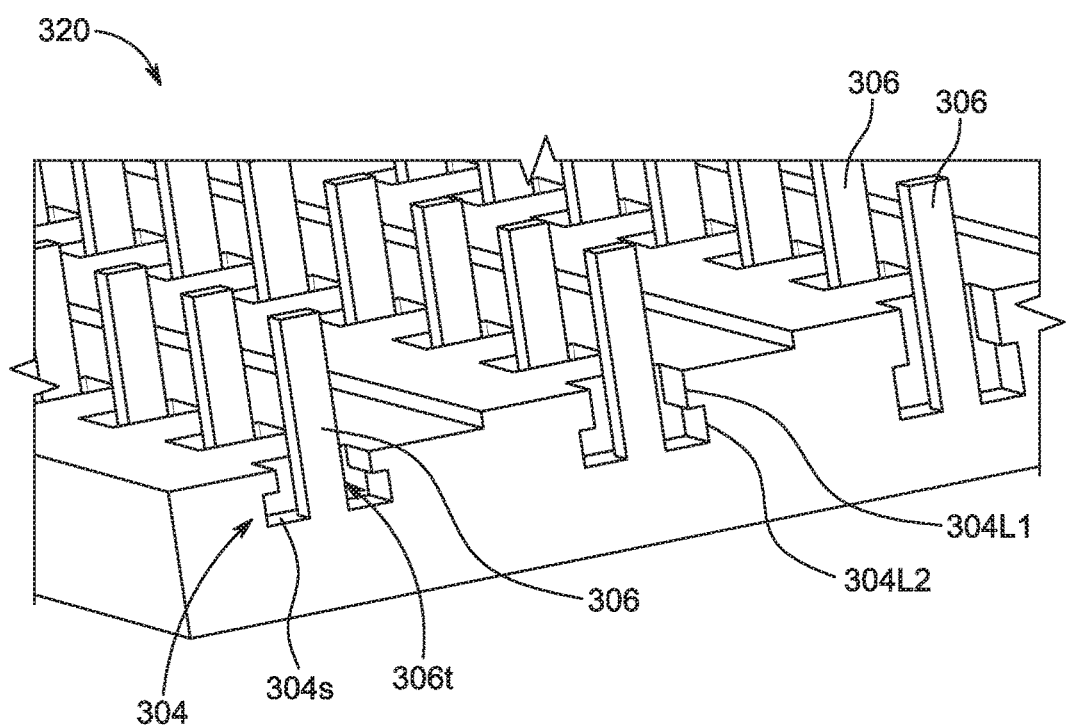
FIG. 3B is a cross-sectional view of the array of FIG. 3A taken along the line L-L.

FIG. 3B is a cross-sectional view of the array 320 taken along the line L-L. As shown, elements 306 are connected to respective supplemental surfaces 304s of the shadowing features 304. The elements 306 may be, for example, FSS elements of an FSS cell. However, other types of elements 306 are contemplated including high frequency filters of electromagnetic devices. It should be understood that, in FIG. 3B, only portions of the elements 306 are shown to illustrate the protective or shielding aspects of the shadowing features 304 on the terminal ends 306t of the elements 306.

As also shown in FIG. 3B, the shadowing region of the shadowing features 304 can vary in shape. That is, surfaces 304l1 and 304l2 of the shadowing region of the shadowing feature 304 can vary in dimensions, thereby creating a geometry of the shadowing region that can be configured to achieve desired (1) amounts of desired protection of the corresponding FSS element from being coated during a metal coating procedure, and (2) properties such as resonance and filtering properties of the resulting FSS cell.

Figure 4A:
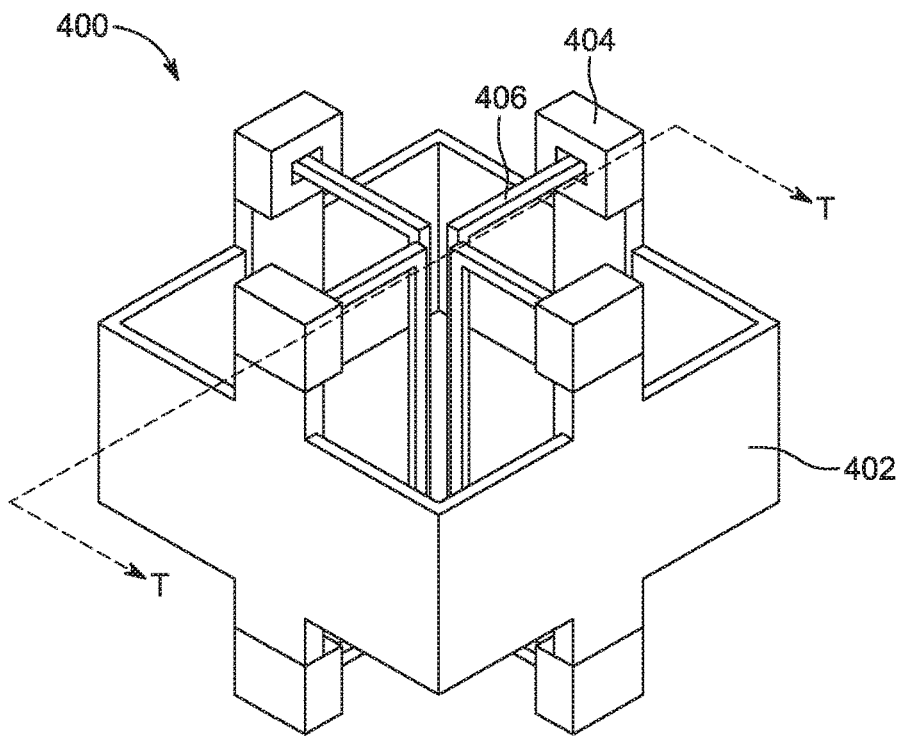
FIG. 4A is a perspective view of another exemplary embodiment of an FSS cell having shadowing features.

FIG. 4A is a perspective view of another exemplary embodiment of an FSS cell 400 having shadowing features. The FSS cell 400 includes walls 402, shadowing features 404 and FSS elements 406. As shown, the walls 402 and the shadowing features of the FSS cell 400 are of different dimensions, such that desired mechanical and electrical properties of the FSS cell, such as the mechanical strength, upper frequency, lower frequency and bandwidth of the FSS elements that make up an FSS filter can be achieved.

Figure 4B:
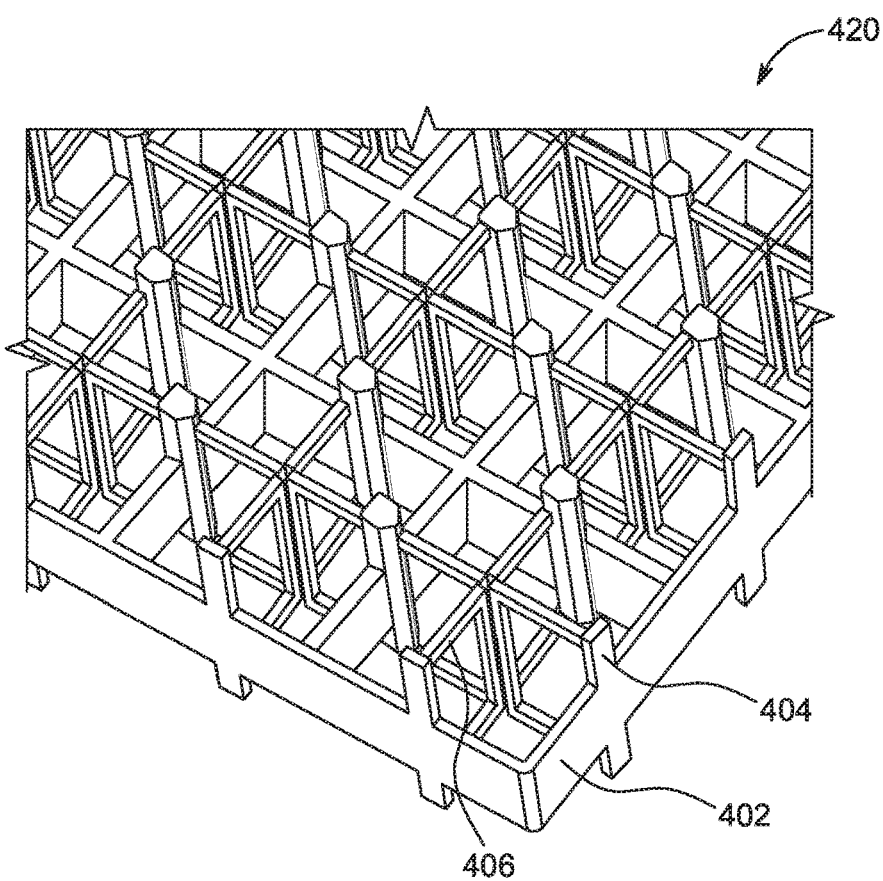
FIG. 4B is a perspective view of an array of the FSS cells of FIG. 4A.

FIG. 4B is a perspective view of an array 420 of FSS cells 400. The array 420 of FSS cells 400 can be fabricated a single structure using additive manufacturing techniques. In some embodiments, fabricating the array 420 of FSS cells 400 provides benefits such as enabling a large number of cells to be handled, transported and manipulated jointly, thereby also allowing for a more uniform coating of the FSS cells, resulting in FSS cells 400 having substantially matching mechanical and electrical properties.

Figure 4C:
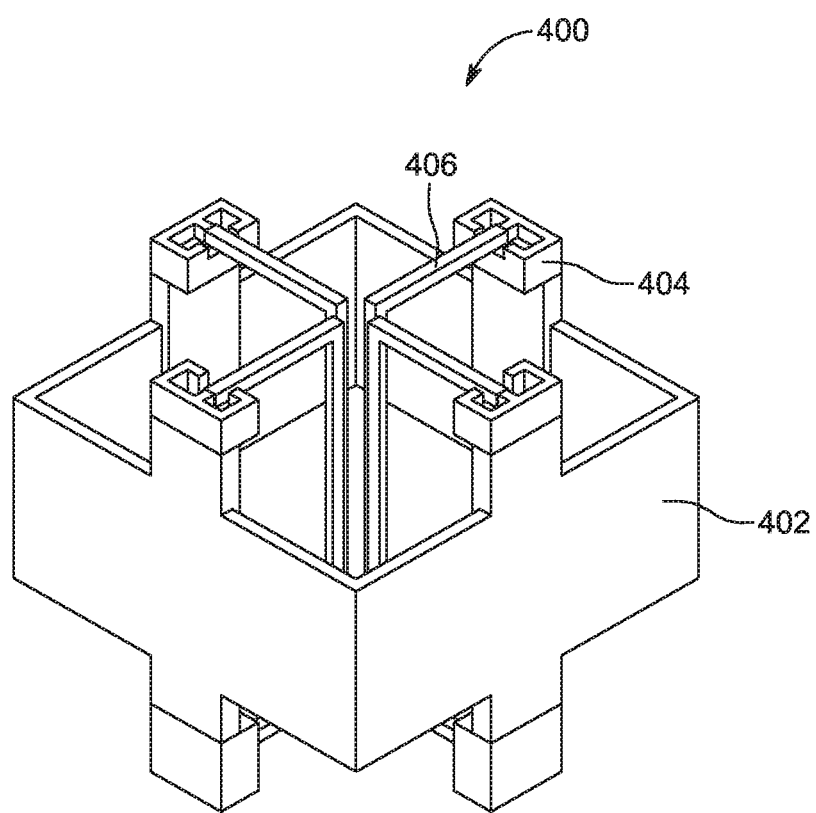
FIG. 4C is a cross-sectional view of the FSS cell of FIG. 4A taken along the line T-T.

FIG. 4C is a cross-sectional view of the FSS cell 400 taken along the line T-T. As shown, the FSS elements 406 extend into and connect to the shadowing features 404 at supplemental surfaces of the shadowing regions that are disposed between the internal surface and the outer surface of the shadowing features 404. In doing so, a distal or end portion or region of each of the FSS elements 406 is shadowed or protected by the shadowing regions, such that metal is not or is less coated thereon.

Printed Circuit Board

In some embodiments, the shadowing features described herein can be fabricated on a printed circuit board (PCB) to protect areas of the PCB from being coated with metal, thereby discontinuing the conductivity between two regions of the PCB. As known by a person having skill in the art, electronic components such as microprocessors and controllers are provided on the board, and are connected to one another using lines or paths of metal (e.g., copper) provided on the board, via which electricity can be conducted. These lines or paths of metal such as copper are referred to as traces.

Figure 5A:
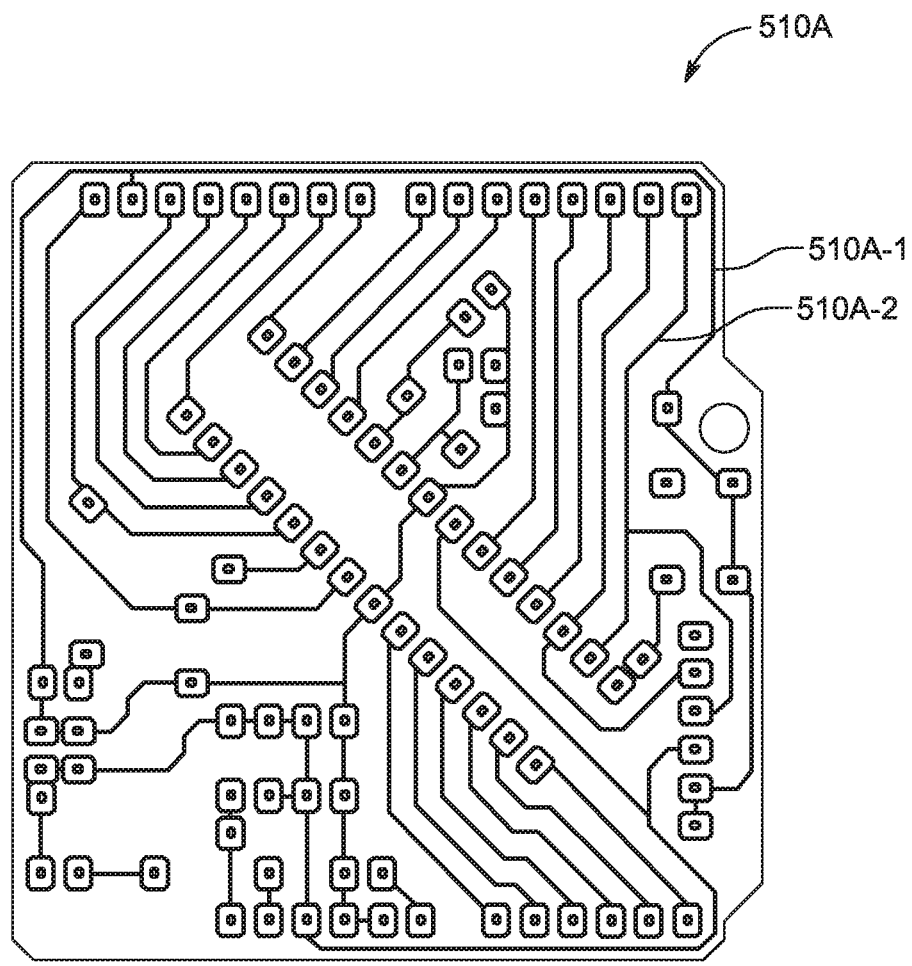
FIG. 5A is an exemplary embodiment of a printed circuit board.
Figure 5B:
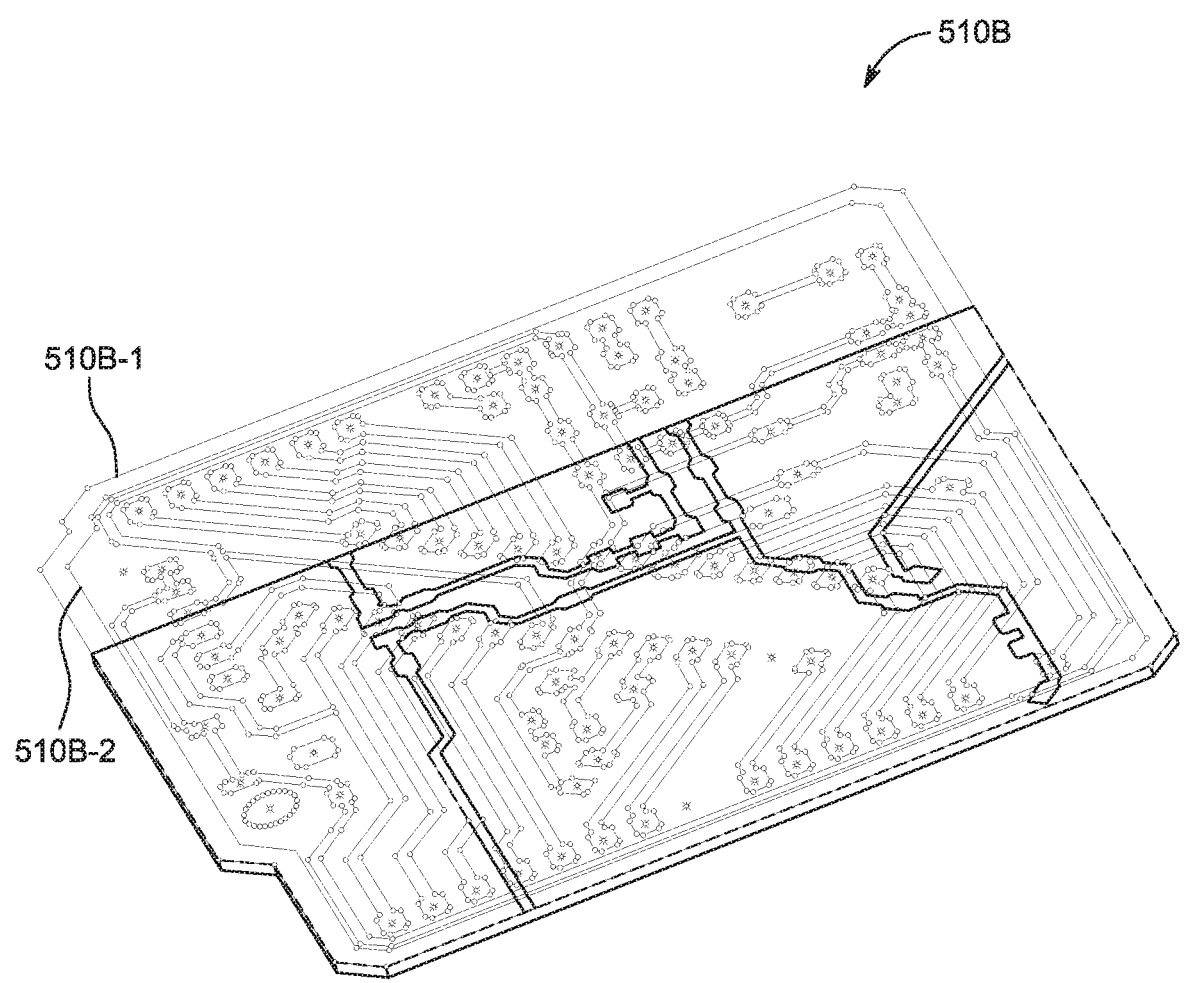
FIG. 5B is another exemplary embodiment of a printed circuit board (PCB)

FIGS. 5A and 5B illustrate exemplary embodiments of PCBs 510A and 510B, each of which includes various traces, including traces 512A-1 and 512A-2 on PCB 510A and traces 512B-1 and 512B-2 on PCB 510B. In FIG. 5B, the substrate of the PCB 510A is illustrated only as extending to a portion of the traces, though it should be understood that a completed and ready-to-use PCB would include all of the traces disposed on or in the substrate. In some embodiments, chips and other components can be placed or positioned on the PCB at ends of traces, as known by a person skilled in the art.

Figure 6A:
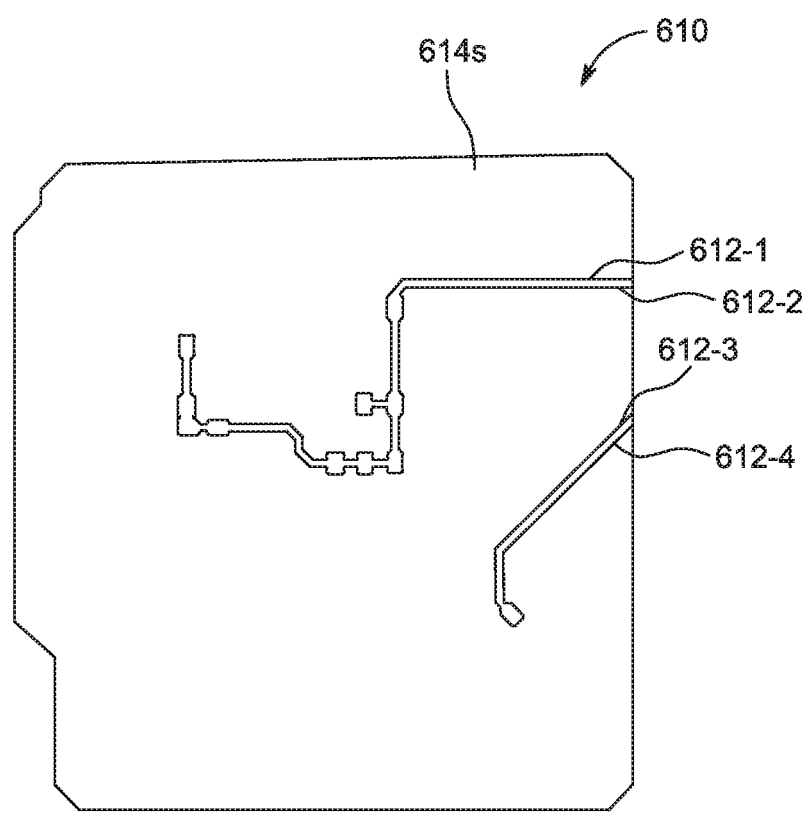
FIG. 6A is a perspective view of an exemplary embodiment of a three-dimensional PCB.

FIG. 6A is a perspective view of an exemplary embodiment of a three-dimensional PCB 610 fabricated with channels 612-1 to 612-4, and shadowing features such that the PCB 610 can be coated with metal while allowing for portions of the board to not be electrically connected. It should be understood that channels 612-1 to 612-4 are exemplary channels from among a larger set of channels that can be printed on a PCB, such as the channels (corresponding to traces) illustrated in FIG. 5B.

Figure 6B:
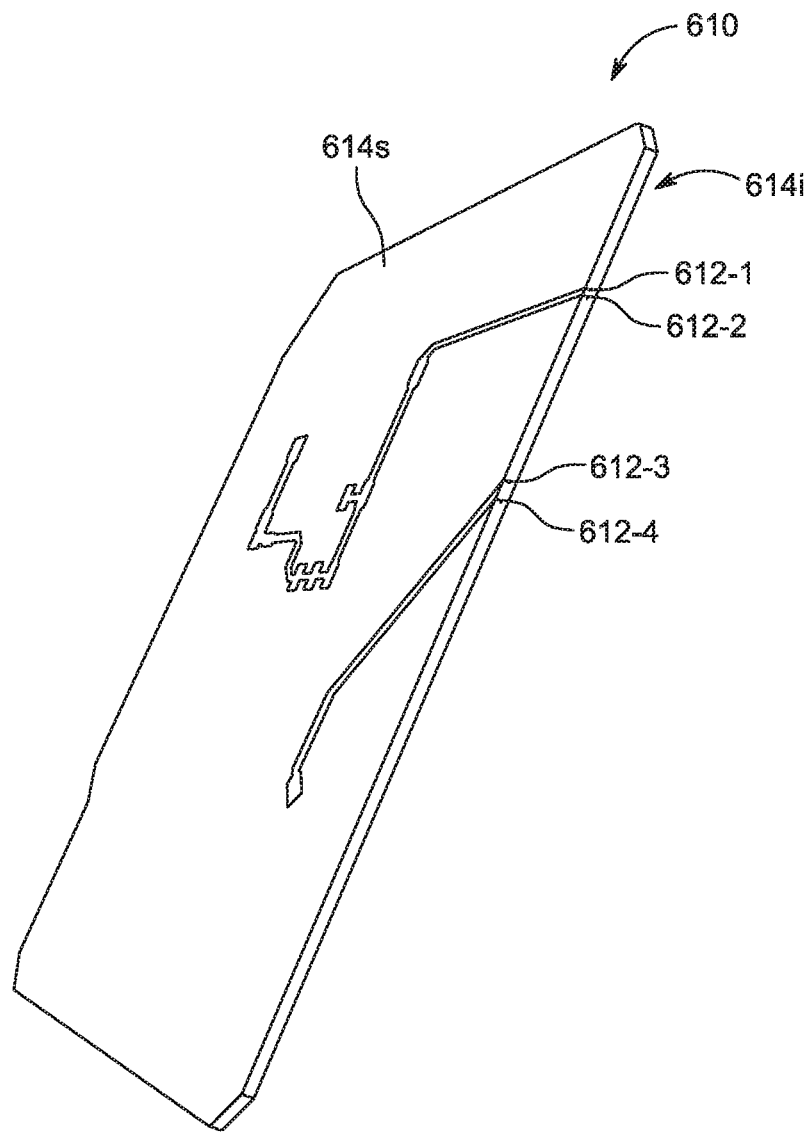
FIG. 6B is another perspective view of the PCB of FIG. 6A.

FIG. 6B illustrates another perspective view of the PCB 610. The PCB 610 includes a top or superior surface 614s and a bottom or inferior surface 614i. In some embodiments, coating of the PCB 610 is performed in a top-down direction, such that metal is deposited onto the superior surface 614s. In some embodiments, the coating is performed in a direction substantially perpendicular to the superior surface 614s of the PCB 610, using coating techniques such as sputtering, physical vapor deposition, electron beam deposition, thermal evaporation based metal deposition, spraying, splattering, splashing, spray painting and the like.

To ensure that conductivity can be discontinued between multiple areas or portions of the PCB 610, regions between those areas should not be coated. To this end, the PCB 610 is fabricated with shadowing features.

Figure 6C:
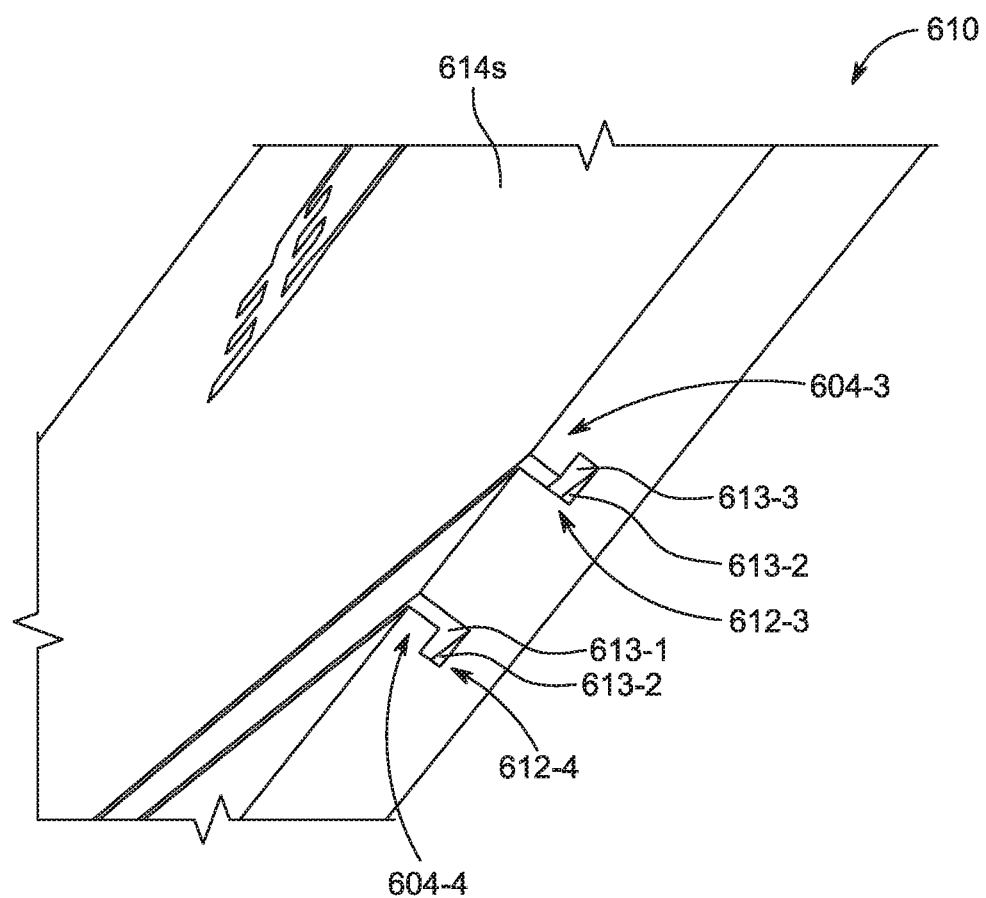
FIG. 6C is a magnified perspective view of the PCB of FIG. 6A.

FIG. 6C is a magnified view of the channels 612-3 and 612-4 along a side or lateral edge of the PCB 610. The channels 612-3 and 612-4 include respective shadowing features 604-3 and 604-4. The shadowing features 604-3 and 604-4 protect surfaces within the channel from being coated with metal during a metal coating process, as is described in more detail with reference to FIG. 6D below. It should be understood that the shadowing features 604-3 and 604-4 are exemplary, and shadowing features of different geometries, and different placements and orientations can be fabricated onto or with the PCB 610, so long as a surface or a portion of a surface within the channels 612-3 and 612-4 can be protected from deposited metal to discontinue electrical conductivity.

Figure 6D:
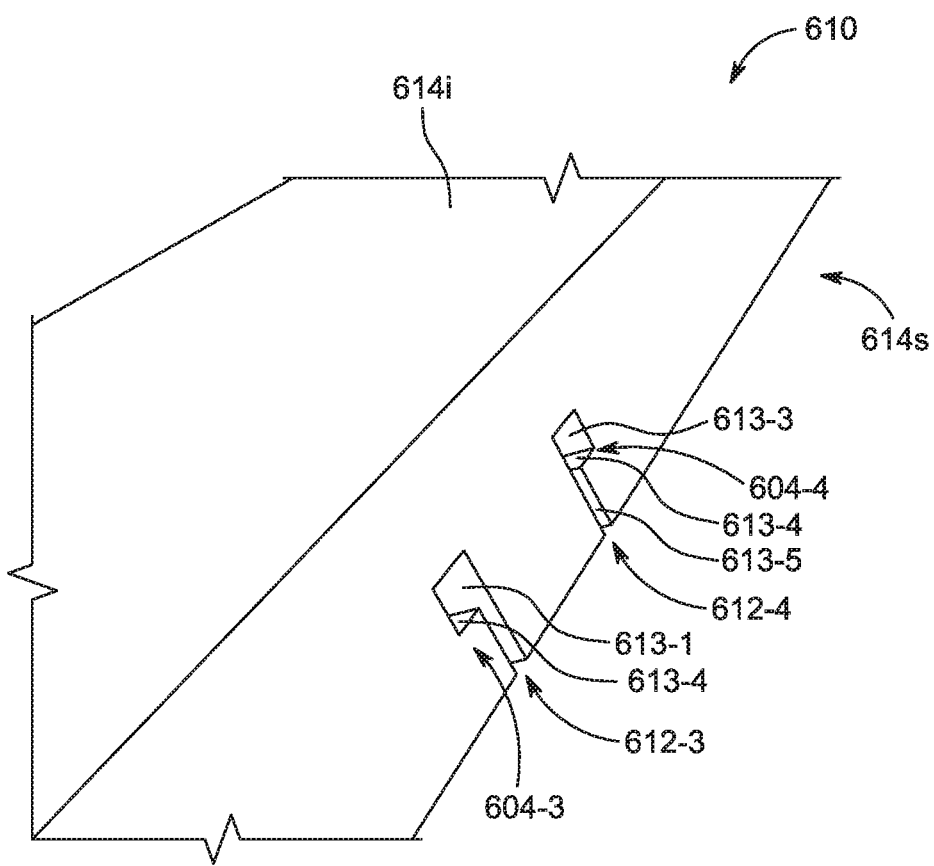
FIG. 6D is another magnified perspective view of the PCB of FIG. 6A.

FIG. 6D is another perspective view of the channels 612-3 and 612-4 along a side or lateral edge of the PCB 610. More specifically, FIG. 6D is an upside-down view of FIG. 6C. While in FIG. 6C the superior surface 614s of the PCB 610 is visible, in FIG. 6D, the inferior surface is visible. As shown, channels 612-3 and 612-4 include shadowing features 604-3 and 604-4, respectively. Moreover, the channels 612-3 and 612-4 include surfaces (e.g., walls) therein, namely surfaces 613-1 to 613-5 (collectively "surfaces" and/or "614").

When a metal coating is applied to the superior surface 614s of the PCB 610, the shadowing features 604-3 and 604-4 prevent the metal from being applied to at least some of the surfaces 613. For instance, when a metal coating is applied to the PCB 610, portions of the superior surface 614s are metal coated and thus gain conductive properties. Examples of these portions of the superior surface that are coated are labeled as 614s-1 and 614s-2 in FIG. 6C. Likewise, during the metal coating, surfaces of the channels 612-3 and 612-4 are metal coated and thus gain conductive properties. Examples of the surfaces that are coated are labeled as 613-1, 613-2 and 613-5 in FIGS. 6C and 6D.

However, the shadowing features 604-3 and 604-4 prevent some surfaces from of the channels 612-3 and 612-4 from being metal coated—e.g., by ensuring that none or less metal is applied to those surfaces. Examples of the surfaces that are protected or shielded by the shadowing features and thus are not or are less metal coated are labeled as channel surfaces 613-3 and 613-4. The non- or less coated channel surfaces 613-3 and 613-4 thus prevent PCB surface regions 614s-1 and 614s-2 from being electrically connected to one another.

It should be understood that the systems and methods herein are described in connection with planar electromagnetic devices such as planar PCBs (e.g., PCB 610). However, the systems and methods described herein can be applied to fabricate and/or coat non-planar (e.g., curved, shaped) structures, or specific junctures in complex structures. Curved or non-planar structures means that at least one plane—e.g., formed by the base of a plurality of electromagnetic devices—is not planar. For instance, a base of the various printed structures (e.g., substrates) provided for herein can be non-planar. It should also be understood that the systems and methods described herein can be used to fabricate other types of devices known by those of skill in the art, including three-dimensional antennas (e.g., Vivaldi antennas) for radar and communications, coplanar waveguides, microwave structures that require a separation between a conductive surface and a ground plane to ensure proper conditions for the transmission and radiation of microwave energy, and/or three-dimensional metamaterials.

Fabrication and Coating of Electromagnetic Devices with Shadowing Features

In some example embodiments, the systems and methods described herein can be used to fabricate and coat an electromagnetic device. Initially, a three-dimensional model corresponding to a three-dimensional structure is generated using modeling software known by those skilled in the art. The three-dimensional structure that is modeled and is to be fabricated can be a single electromagnetic device such as an FSS unit cell, a printed circuit board or other electromagnetic devices known to those skilled in the art. In other embodiments, the modeled structure to be fabricated can include a plurality of electromagnetic devices arranged, for example, as an array. The three-dimensional model is designed to include shadowing features that protect, shield or shadow other portions of the structure during a coating process. It should be understood that in some embodiments, shadowing features can be referred to as embedded masks—meaning that the resulting structure is designed to include or have incorporated therein geometric features that can replace the need for a mask to provide the desired metal coating of the structure.

In turn, the modeled three-dimensional structure is printed using additive manufacturing techniques such as three dimensional printing. In some embodiments, a three-dimensional structure that is printed can be a substrate for an electromagnetic device, made of a non-conductive material such as plastic, silicon, or fiberglass. The fabricated substrate can be rigid or flexible. In some embodiments, the fabricated substrate can be planar or non-planar. For instance, a non-planar or curved substrate. The fabricated substrate includes shadowing features that are designed to provide the desired amount of shadowing of another portion of the structure. In some embodiments, the amount of shadowing that is desired or optimal is a size or dimension that results in the other portion of the structure being not coated with metal or coated with metal less than other portions such that it can serve as a boundary that cuts off conductivity between two coated and conductive portions or regions of the structure.

In turn, the structure is coated with a metal such as copper using a variety of coating techniques described herein. Coating can consist of depositing the metal onto a structure from a specific point or a bounded set of points that are taken into account when designing, modeling and fabricating the shadowing features of the structure. For instance, in embodiments in which metal coating is applied from a single point at the top-center portion of the structure, the shadowing features are disposed on top of the element or region of the structure to be shadowed, or at a point substantially along a line from the element or region to be shadowed and the point from which the coating is performed (e.g., a nozzle). In this way, at least a portion of the structure has less or no conductivity, thereby discontinuing the conductivity between two regions adjacent to the non-coated (or less-coated) portion of the structure.

One skilled in the art will appreciate further features and advantages of the disclosure based on the above-described embodiments. Accordingly, the disclosure is not to be limited by what has been particularly shown and described, except as indicated by the appended claims. All publications and references cited herein are expressly incorporated herein by reference in their entirety.

What is claimed is:

1. A method for producing an electromagnetic device, comprising:
    performing additive manufacturing using a polymer to produce a device having a plurality of interconnected walls and a plurality of frequency selective surface elements, each frequency selective surface element of the plurality of frequency selective surface elements having first and second terminal ends with the first terminal end of each frequency selective surface element being coupled to a wall of the plurality of interconnected walls and the second terminal end of each frequency selective surface element being coupled to a wall of the plurality of interconnected walls; and
    coating portions of the device with a conductive material, wherein a plurality of shadowing features are formed as part of one or more walls of the plurality of interconnected walls, the shadowing features being configured to protect a portion of the frequency selective surface element disposed therein from being coated by the conductive material during the coating step, and
    wherein:
        each of the plurality of shadowing features comprises a concave portion defining a shadowing region, and
        the first terminal end of each frequency selective surface element is coupled to the wall within the shadowing region of a respective one of the plurality of shadowing features such that said shadowing feature is configured to protect said first end of the frequency selective surface element from being coated by the conductive material during the coating step.

2. The method of claim 1, wherein the step of coating portions of the device with a conductive material is performed without the use of a mask or other outside object disposed over a surface onto which the conductive material is deposited to control a location of the conductive material.

3. The method of claim 1, wherein the plurality of interconnected walls and the plurality of frequency selective surface elements are produced simultaneously during a single manufacturing pass.

4. The method of claim 1, wherein the plurality of shadowing features are formed as part of one or more walls of the plurality of interconnected walls during the time the step of performing additive manufacturing using a polymer to produce a device having a plurality of interconnected walls is performed.

5. The method of claim 1, wherein a base formed by the plurality of interconnected walls is non-planar.

6. A method for producing an electromagnetic device, comprising:
    providing a substrate having a plurality of interconnected walls and one or more shadowing features, the one or more shadowing features being configured to shadow portions of the substrate; and
    depositing a conductive material onto the substrate such that at least one of the following occurs: portions of the substrate shadowed by the one or more shadowing features receive less conductive material than portions of the substrate that are not shadowed by the one or more shadowing features due to the one or more shadowing features shadowing the substrate, or portions of the substrate shadowed by the one or more shadowing features receive no conductive material, due to the one or more shadowing features shadowing the substrate, the depositing of the conductive material producing an electromagnetic device,
    wherein the electromagnetic device has electromagnetic functionality, and
    wherein:
        each shadowing feature of the one or more shadowing features comprises a concave portion defining a shadowing region, and
        a first terminal end of a frequency selective surface element coupled to a wall of the plurality of interconnected walls within the shadowing region of a respective one of the one or more shadowing features such that said shadowing feature is configured to protect said first terminal end of the frequency selective surface element from having the conductive material deposited thereon during the depositing step.

7. The method of claim 6, wherein the step of depositing a conductive material onto the substrate is performed without the use of a mask or other outside object disposed over a surface onto which the conductive material is deposited to control a location of the conductive material.

8. The method of claim 6, wherein the substrate comprises a plurality of frequency selective surface elements, each frequency selective surface element of the plurality of frequency selective surface elements having first and second terminal ends, the first terminal end of each frequency selective surface element being coupled to a wall of the plurality of interconnected walls and the second terminal end of each frequency selective surface element being coupled to a wall of the plurality of interconnected walls, and wherein the one or more shadowing features are formed as part of one or more walls of the plurality of interconnected walls, and the portions of the substrate shadowed by the one or more shadowing features includes at least one of a portion of the frequency selective surface element or a portion of the wall to which the frequency selective surface element is coupled.

9. The method of claim 6, wherein the substrate comprises a plurality of channels formed therein that include the plurality of interconnected walls and extend through a portion of a thickness of the substrate such that a depth of the channel is less than a thickness of the portion of the substrate in which the respective channel is formed, at least one channel of the plurality of channels including the one or more shadowing features, and wherein depositing a conductive material onto the substrate results in forming a plurality of traces in conjunction with the plurality of channels, with the portions of the at least one channel including the one or more shadowing feature receiving at least one of less conductive material than portions of the at least one channel that are not shadowed by the one or more shadowing features due to the one or more shadowing features shadowing the at least one channel, or no conductive material due to the one or more shadowing features shadowing the at least one channel.

10. The method of claim 6, wherein providing a substrate having a plurality of interconnected walls and one or more shadowing features further comprises performing additive manufacturing to produce the substrate having a plurality of interconnected walls and one or more shadowing features.

11. The method of claim 10, wherein the substrate comprises a plurality of frequency selective surface elements, each frequency selective surface element of the plurality of frequency selective surface elements having first and second terminal ends, the first terminal end of each frequency selective surface element being coupled to a wall of the plurality of interconnected walls and the second terminal end of each frequency selective surface element being coupled to a wall of the plurality of interconnected walls, wherein the one or more shadowing features are formed as part of one or more walls of the plurality of interconnected walls, and the portions of the substrate shadowed by the one or more shadowing features includes at least one of a portion of the frequency selective surface element or a portion of the wall to which the frequency selective surface element is coupled, and wherein the plurality of interconnected walls and the plurality of frequency selective surface elements are produced simultaneously during a single manufacturing pass.

12. The method of claim 10, wherein the substrate comprises a plurality of channels formed therein that include the plurality of interconnected walls and extend through a portion of a thickness of the substrate such that a depth of the channel is less than a thickness of the portion of the substrate in which the respective channel is formed, at least one channel of the plurality of channels including the one or more shadowing features, and wherein the plurality of channels formed in the substrate and the at least one channel of the plurality of channels that includes the one or more shadowing features are produced simultaneously during a single manufacturing pass.

13. The method of claim 6, wherein a base formed by the plurality of interconnected walls is non-planar.

14. A method for producing an electromagnetic device, comprising:

performing additive manufacturing using a polymer to produce a device having a plurality of interconnected walls and a plurality of frequency selective surface elements, each frequency selective surface element of the plurality of frequency selective surface elements having first and second terminal ends with the first terminal end of each frequency selective surface element being coupled to a wall of the plurality of interconnected walls and the second terminal end of each frequency selective surface element being coupled to a wall of the plurality of interconnected walls; and coating portions of the device with a conductive material, wherein a plurality of shadowing features are formed as part of one or more walls of the plurality of interconnected walls, the shadowing features being configured to protect a portion of the frequency selective surface element disposed therein from being coated by the conductive material during the coating step, and wherein:

each of the plurality of shadowing features comprises a convex portion defining a shadowing region, and the first terminal end of each frequency selective surface element is coupled to the wall within the shadowing region of a respective one of the plurality of shadowing features such that said shadowing feature is configured to protect said first end of the frequency selective surface element from being coated by the conductive material during the coating step.

15. The method of claim 14, wherein the step of coating portions of the device with a conductive material is performed without the use of a mask or other outside object disposed over a surface onto which the conductive material is deposited to control a location of the conductive material.

16. The method of claim 14, wherein the plurality of interconnected walls and the plurality of frequency selective surface elements are produced simultaneously during a single manufacturing pass.

17. The method of claim 14, wherein the plurality of shadowing features are formed as part of one or more walls of the plurality of interconnected walls during the time the step of performing additive manufacturing using a polymer to produce a device having a plurality of interconnected walls is performed.

18. The method of claim 14, wherein a base formed by the plurality of interconnected walls is non-planar.

19. A method for producing an electromagnetic device, comprising:

providing a substrate having a plurality of interconnected walls and one or more shadowing features, the one or more shadowing features being configured to shadow portions of the substrate; and depositing a conductive material onto the substrate such that at least one of the following occurs: portions of the substrate shadowed by the one or more shadowing features receive less conductive material than portions of the substrate that are not shadowed by the one or more shadowing features due to the one or more shadowing features shadowing the substrate, or portions of the substrate shadowed by the one or more shadowing features receive no conductive material, due to the one or more shadowing features shadowing the substrate, the depositing of the conductive material producing an electromagnetic device, wherein the electromagnetic device has electromagnetic functionality, and wherein:

each shadowing feature of the one or more shadowing features comprises a convex portion defining a shadowing region, and a first terminal end of a frequency selective surface element coupled to a wall of the plurality of interconnected walls within the shadowing region of a respective one of the one or more shadowing features such that said shadowing feature is configured to protect said first terminal end of the frequency selective surface element from having the conductive material deposited thereon during the depositing step.

20. The method of claim 19, wherein the step of depositing a conductive material onto the substrate is performed without the use of a mask or other outside object disposed over a surface onto which the conductive material is deposited to control a location of the conductive material.

21. The method of claim 19, wherein the substrate comprises a plurality of frequency selective surface elements, each frequency selective surface element of the plurality of frequency selective surface elements having first and second terminal ends, the first terminal end of each frequency selective surface element being coupled to a wall of the plurality of interconnected walls and the second terminal end of each frequency selective surface element being coupled to a wall of the plurality of interconnected walls, and wherein the one or more shadowing features are formed as part of one or more walls of the plurality of interconnected walls, and the portions of the substrate shadowed by the one or more shadowing features includes at least one of a portion of the frequency selective surface element or a portion of the wall to which the frequency selective surface element is coupled.

22. The method of claim 19, wherein providing a substrate having a plurality of interconnected walls and one or more shadowing features further comprises performing additive manufacturing to produce the substrate having a plurality of interconnected walls and one or more shadowing features.

23. The method of claim 22, wherein the substrate comprises a plurality of frequency selective surface elements, each frequency selective surface element of the plurality of frequency selective surface elements having first and second terminal ends, the first terminal end of each frequency selective surface element being coupled to a wall of the plurality of interconnected walls and the second terminal end of each frequency selective surface element being coupled to a wall of the plurality of interconnected walls, wherein the one or more shadowing features are formed as part of one or more walls of the plurality of interconnected walls, and the portions of the substrate shadowed by the one or more shadowing features includes at least one of a portion of the frequency selective surface element or a portion of the wall to which the frequency selective surface element is coupled, and wherein the plurality of interconnected walls and the plurality of frequency selective surface elements are produced simultaneously during a single manufacturing pass.

24. The method of claim 19, wherein a base formed by the plurality of interconnected walls is non-planar.

\* \* \* \* \*